United States Patent [19]

Hamaoui

[11] 4,053,844
[45] Oct. 11, 1977

[54] CARD-READER INTEGRATED CIRCUIT TESTER

[75] Inventor: Moise N. Hamaoui, Sunnyvale, Calif.

[73] Assignees: Moise N. Hamaoui; Halfon N. Hamaoui; Robert Hacco, all of Sunnyvale, Calif.; part interest to each

[21] Appl. No.: 617,242

[22] Filed: Sept. 26, 1975

[51] Int. Cl.² .................... H03F 21/00; G01R 19/00
[52] U.S. Cl. ................................. 330/2; 235/61.7 R; 324/73 R
[58] Field of Search .............. 330/2; 324/73 R; 235/61.12 R

[56] References Cited
U.S. PATENT DOCUMENTS

| 3,219,927 | 11/1965 | Topp et al. | 324/73 R |
|---|---|---|---|
| 3,302,109 | 1/1967 | Jones | 324/73 R |
| 3,522,532 | 8/1970 | McCoy | 330/2 X |
| 3,581,074 | 5/1971 | Waltz | 324/73 R X |
| 3,631,229 | 12/1971 | Bens | 324/73 R X |
| 3,649,910 | 3/1972 | Vinsani | 324/73 R |
| 3,673,397 | 6/1972 | Schaefer | 324/73 R X |

FOREIGN PATENT DOCUMENTS

372,364   5/1932   United Kingdom .............. 235/61.12

Primary Examiner—James B. Mullins
Attorney, Agent, or Firm—C. Michael Zimmerman

[57] ABSTRACT

A method and apparatus are described for testing electronic circuit devices for proper operation and parameter tolerance levels. The apparatus includes a card reader for extracting from a plurality of programming cards comparison values against which actual parameter values of a device under test are to be compared; a memory for storing a plurality of comparison values for each parameter of the device to be checked, which different comparison values represent different tolerance levels or bins for the device; test circuitry for measuring the actual values of the parameters of a device under test; a comparator for comparing each of such actual values with the various tolerance comparison values for the same; and a visual display screen for displaying the results of the comparison. The method includes marking a decimal numeric Hollerith code on the programming cards with the comparison values and then feeding the same through a card reader to the memory for later recall of such comparison values as needed for comparisons.

20 Claims, 4 Drawing Figures

CARD-READER INTEGRATED CIRCUIT TESTER

BACKGROUND OF THE INVENTION

The present invention relates to the testing of electronic circuit devices, such as integrated circuit chips and operational amplifiers, and more particularly to an improved method and apparatus for such testing.

The circuit components for electronically operated devices, such as hand-held calculators, are typically produced in large quantities on a mass production basis. The proper operability of each circuit component is then checked by comparing its various electrical parameters, such as input current, etc., against comparison values. Since different types of electronically operated equipment typically have differing tolerance requirements for their components, manufactured components are checked not only to determine whether or not they meet certain minimum requirements, but also to classify or categorize the same into groups meeting certain tolerance levels.

Apparatuses provided in the past to check or test the operation and electrical parameter tolerances of circuit components generally require some computer operation skill in order to be properly used. That is, most of such devices typically are general purpose digital computers which are programmed to control the testing operation. It is therefore generally necessary that for each different device to be tested, and whenever the criteria for a test is changed, that the applications program stored in the computer be altered. This generally requires the services of a computer programmer. The new program or alterations on existing programs must then be entered into the computer through, for example, an alphanumeric keyboard or the like of a conventional input terminal. It will be recognized that it would be desirable to eliminate the necessity of requiring a computer programmer or the like for this purpose, particularly if the manufacturer of the circuit devices typically manufactures many different devices.

SUMMARY OF THE INVENTION

The present invention relates to a method and apparatus for checking one or more electrical parameters of an electronic circuit device in a simple and straight-forward manner requiring no more than semi-skilled labor. In its basic aspects, the invention relies on the use of a programming card having an easily understood and usable decimal numerical indicia, preferably in the form of Hollerith code, for indicating the various comparison values against which the actual parameters of an electronic circuit device to be tested are checked. That is, the invention includes a method for checking the electrical parameters of an electronic circuit device which relies on the simple ability to mark a numeric Hollerith code on a programming card with, for example, a pencil to provide the comparison values which are required for the desired testing. The apparatus then includes a card reader capable of extracting from such a programming card the information which provides the comparison value or values for the parameter or parameters to be checked, as well as means for measuring the value of the parameter, means for comparing the measured value with the comparison value entered by the programming card, and means for displaying the results of such comparison.

Most desirably, the apparatus of the invention further includes memory means for receiving the comparison values from the card reader and storing the same for later recall as needed when each of the parameters of interest is to be checked. In this connection, such memory means preferably includes address locations for comparison values for a plurality of different parameters to be checked. Further, the memory means also must desirably includes address locations for a plurality of different tolerance comparison values for each parameter to be checked. Such differing tolerance limits then define so-called "bins" or quality classification groups into which the various electronic circuit devices of any one kind can be distributed.

A simple and yet quite effective test circuit is also included as part of the invention for measuring the input currents, i.e., the input bias current and the input offset current, flowing into the primary input terminals of an operational amplifier to be tested. Such test circuit provides the desired measurement of such input currents with a pair of second operational amplifiers connected respectively to the input terminals of the operational amplifier under test.

The invention includes other features and advantages which will be described or will become apparent from the following more detailed description of a preferred embodiment thereof.

BRIEF DESCRIPTION OF THE DRAWING

With reference to the accompanying three sheets of drawing.

DETAILED DESCRIPTION OF THE PREFERRED EMBODIMENTS

Figure 1:
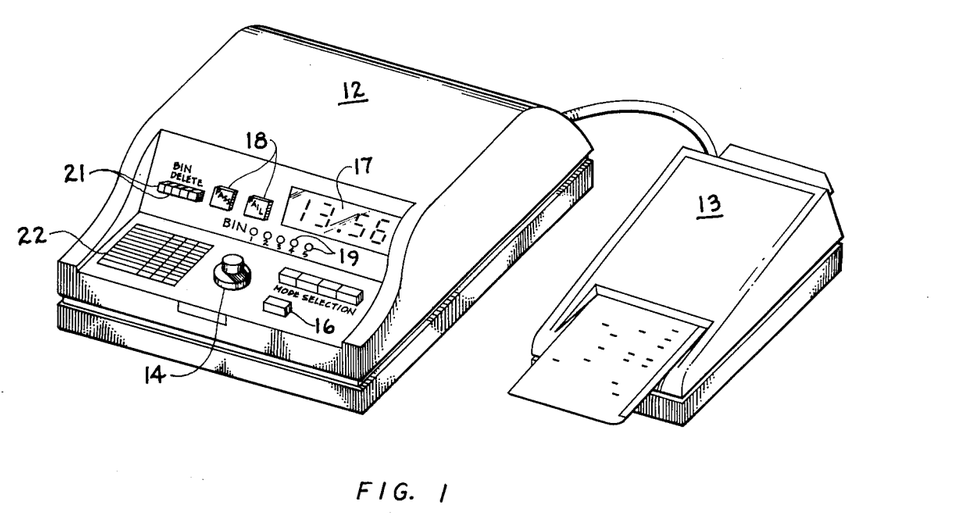
FIG. 1 is an isometric view of a preferred embodiment of apparatus of the invention for checking one or more electrical parameters of an electronic circuit device to be tested.
Figure 2:
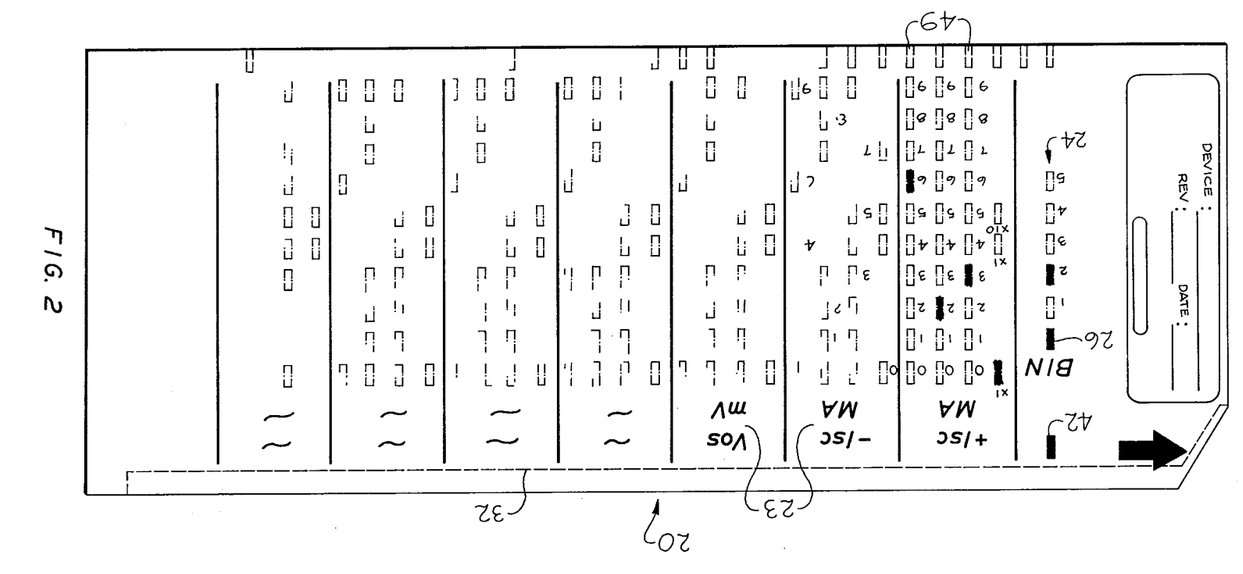
FIG. 2 is an enlarged plan view of a programming card of the invention.

Reference is first made to FIGS. 1 and 2 for a general description of the apparatus and the simplicity of the method for its use to check electrical parameters of a plurality of electronic circuit devices.

The apparatus, generally referred to in FIG. 1 by the reference numeral 11, includes a bench top tester 12 and a card reader 13 for entering comparison values therein. After comparison values are so entered in the manner to be described, it is a simple matter to use the apparatus to test circuit devices against such comparison values. In this connection, a socket 14 is provided on the panel of the tester 12 for connection of the devices with the test circuitry of the tester. After a device is suitably plugged into the socket 14, the operator need only push the test button 16 to initiate operation of the tester. As will be discussed, the tester will then automatically compare a plurality of different electrical parameters of the device with selected comparison values. Moreover, each parameter will be checked against different tolerance comparison values so that the device under test can be categorized as being of a particular quality.

The tester includes on its front panel a visual display 17 of, for example, light emitting diodes to display the actual and comparison values of the parameter being tested at any particular time. Moreover, the unit includes a pair of pass and fail lights 18 which indicate whether or not the value displayed represents a value which is within the tolerance range defined by the comparison value. The panel also includes five differing display lights 19 which denote a quality classification group or "bin" against which the device is being tested at any particular time. In this connection, bin delete buttons 21 are included to enable an operator to bypass in a test any bin which is not of interest.

The display panel or the tester 12 also includes a list 22 of the various parameters of a device which will be automatically checked by the tester 12. Adjacent each listed parameter are pass and fail lights which will indicate to the operator which test it is that the tester is at any one time performing on the device to be checked, as well as the results of such specific test. By correlating the display from the bin lights with the display alongside the parameters, an operator can easily determine which tested parameter it is that places or distributes a device under test in a certain classification group.

From the above, it will be seen that the apparatus of the invention will automatically perform a relatively complicated testing operation without requiring significant interaction with an operator. That is, the operator need only insert the device to be tested in the socket, depress the test button and watch the displays to ascertain whether or not the device under test is of an acceptable quality and, if it is, into which quality classification group it should be placed. It should be noted that instead of requiring an operator to plug a device into the socket 14 and then depress the button 16 in order to initiate testing, the device can simply be modified to be loaded and operated by an automatic device handler or the like if desired.

As previously mentioned, one particularly salient features of the instant invention relates to the manner in which different comparison values are entered into the tester. Card reader 13 enables such data entry in a simple manner requiring no special skills. This simplicity is particularly enhanced by the design of the programming cards. As is exemplified by the card shown in FIG. 2, a Hollerith code is used to set forth a decimal numerical system defining an array of potential comparison values for each parameter to be checked. Because it is a decimal numerical system which is provided by the Hollerith code, use of the same does not require any special knowledge. That is, an operator need only know the standard decimal system to be able to mark the card to indicate a desired comparison value. The card is then appropriately coded for reading by the card reader.

More specifically, the card illustrated in FIG. 2 is designed to enter into the tester comparison values for seven different parameters of, for example, an operational amplifier to be tested. In this connection, it will be seen that a major portion of the card, generally indicated by the reference numeral 20, is divided into seven different sections 23 of numerical marking locations providing a Hollerith code decimal system for each of the seven parameters. While for simplicity only the first section - section 23' - is shown complete, the other six sections also include a full three digit Hollerith code decimal system. That is, each section 23 includes ten horizontal rows and three columns of marking locations, with each horizontal row of each section being identified by one of the numbers 0 to 9, and the three columns providing sequential decimal digits. Also, each section includes an initial column having marking locations for setting a decimal point location. Thus, for an operator indicate on the card a desired comparison value for a specific parameter to be checked, the operator need only mark with a pencil or the like those marking locations correlated with the decimal system representative of the comparison value. As an example, the array of comparison values provided in the first section 23' identified with the heading +Isc (positive supply current) is marked to indicate a comparison value of 32.6 microamperes. Comparison values for each of the other parameters listed on the card can be entered thereon in the same manner. It should be noted that besides the card acting as means for entering the comparison values into the tester, it also provides a permanent, understandable record of the comparison values.

As previously mentioned the tester is designed to categorize a plurality of devices being tested into different categories or, as they are called in the art, bins, by comparing each against differing tolerance comparison values for each parameter. Thus, it is necessary that the card not only indicate a comparison value for each of the various parameters, but also indicate which classification group or bin the comparison values on the card represent. The card therefore includes a second response area to be marked to indicate a selected classification group. That is, the card includes a column 24 marked "BIN" having five non-coded selectable marking indicia from which one is to be selected and marked by an operator to indicate to which classification group the various comparison values provided by the card belong. For illustraton purposes, the indicia for bin 2 is marked on the card shown in FIG. 2.

It will be noted that column 24 also includes a permanent marking at 26. The purpose of this marking is to indicate to the card reader and, hence, tester, which specific parameters are on the card. In this connection, there are often more than seven different parameters of a device that should be checked. Thus the mark 26 indicates to the card reader for which seven of these parameters the card provides comparison values, and assures that the same will be placed in the proper address locations in the memory as will be described. Additional comparison values can be provided on other cards which either will not have the mark 26 or will have it at another location indicative of the specific parameter comparison values provided by such card.

Figure 3:
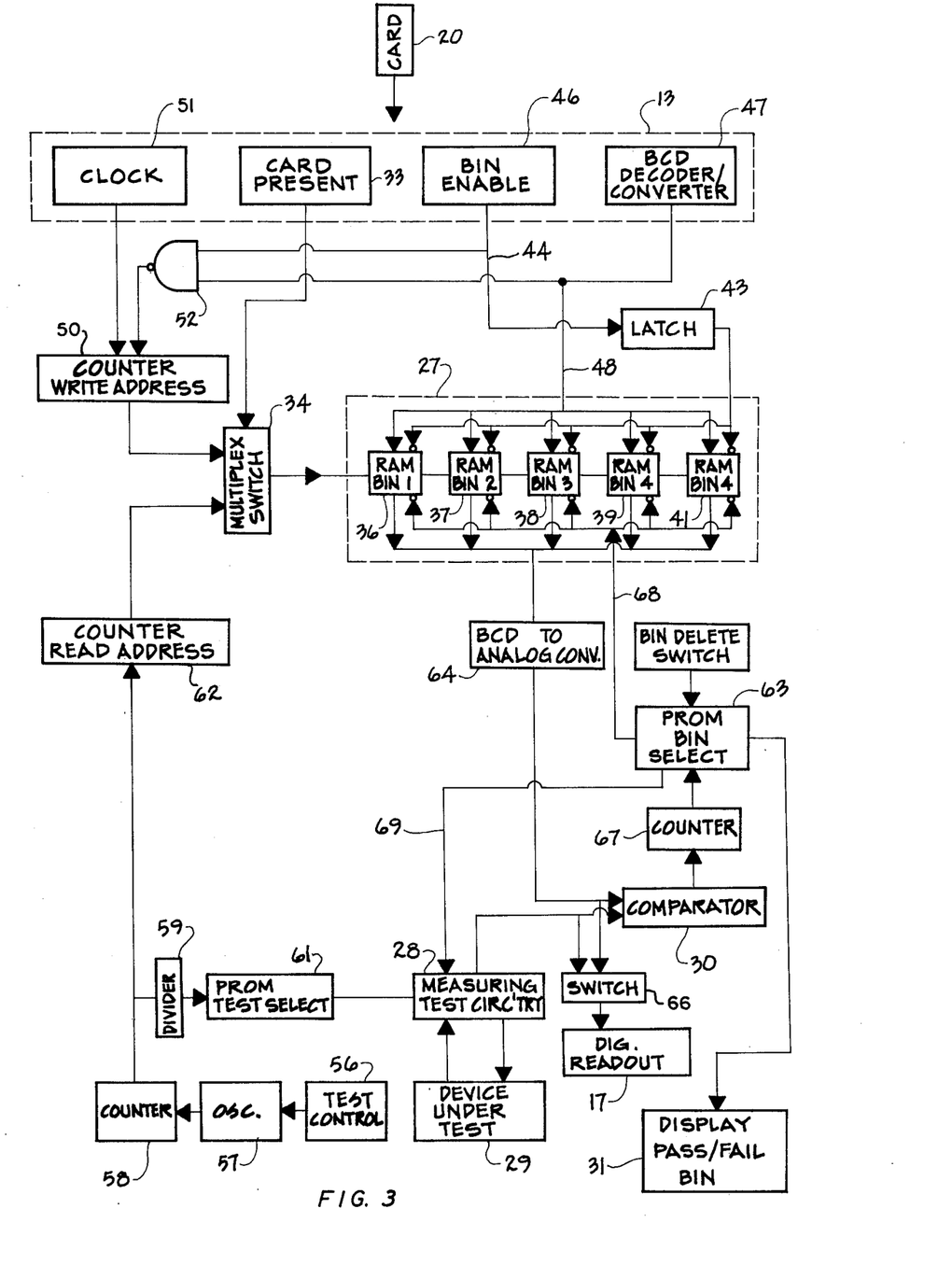
FIG. 3 is a logic block diagram of a preferred embodiment of the invention.

The block diagram of FIG. 3 illustrates the major functional components of the card reader 13 within a dotted line enclosure also referred to by the reference numeral 13. Such card reader is, for example, the one being marketed by the Hewlitt Packard Corporation with model number 9870A. Upon passage of card 20 having the desired indicia thereon, the card reader extracts the information on it providing comparison values for the parameters to be checked, and feeds the same to a memory in the tester 12 generally indicated in FIG. 3 by the dotted line enclosure 27. The tester 12 also includes measuring test circuitry 28 for measuring the value of the parameter of an electronic circuit device indicated at 29 to be checked. A comparator 30 is provided for receiving both the measured value of a parameter being checked and a comparison value therefor from the memory 27 to compare the same. The results of the comparison will then be displayed visually as will be described in more detail hereinafter at the various displays on the device as represented at 31 in FIG. 3.

In more detail, when a card 20 which has been previously programmed in the manner discussed above, is fed into the card reader 13, the card reader automatically readies the memory 27 to receive comparison value information. That is, the card is provided with a permanent mark 32 (FIG. 2) extending longitudinally for the full length of the card on its underneath side adjacent a side edge. Such mark in this third response area is read by the card reader as represented by the "card present" block 33 which, whenever such a mark is so read, directs a multiplex switch 34 to switch the memory 27 from an output mode at which it can provide information to the comparator 30, to an entry mode for receiving comparison value information from a card. The reading of such mark 32 by the card reader also triggers the card reader to extract data from the card passing therethrough.

As the card 20 passes through the reader 13, the first information which is extracted therefrom is the bin or classification group information. In this connection, it should be noted that the memory 27 is actually provided by five RAM devices 36–41, each of which provides address locations for a different bin. The card reader thus first acts to ready for receipt of comparison value information, whichever one of the RAMs is associated with the bin marked on the card. In this respect, as illustrated in FIG. 2, the card is provided at the bin column with a permanent latch enabling mark 42 which enables a latch 43 to pass bin information from the card. This operation is represented in FIG. 3 by having the output line 44 of a card reader sensor 46 for the mark 42 directed to the latch 43. The RAM (bin) information provided in the bin column on the card as read by the card reader decoder 47 is then passed through the latch as represented by the line 48 to enable the RAM associated with the selected bin to receive the comparison value information on the card. For example, if as shown for the card 20 of FIG. 2 it is the second bin which is marked, the decoder 47 will provide such bin information through the latch 43 on an appropriate output line to energize RAM 37 to receive comparison value information during the passage of the card though the card reader.

Card 20 provides not only comparison value information, but information as to the address location for such information in the RAM which is energized. More particularly, the card is provided with a plurality of strobe marks 49 on its underneath side along its longitudinal edge opposite the edge having the card present mark 32. Each strobe mark 49 is aligned as illustrated with a corresponding one of the data columns providing the comparison value information. Moreover, one of such marks is aligned with the bin information column 24.

The strobe marks 49 provide, in effect, a clock which operates a counter 50 as the card passes through the card reader. This functional relationship is indicated in the block diagram by the counter 50 being fed by the output of a clock 51 in the card reader 13. The counter 50 is responsive to the strobe mark clock 51 by sequentially activating address locations in the RAM (or bin) which is energized in order to receive the comparison value information. In this connection, a reset AND gate 52 is provided for resetting the counter to being counting from zero when the card 20 includes the mark 26. That is, the inputs to the reset AND gate 52 are connected to the output lines of the bin enable block 46 and the BCD decoder 47 in order to provide such reset when both an ENABLE mark 42 and the RESET mark 46 are included on the card. It should be noted that this particular embodiment is designed to accept different comparison values from two different programming cards. Only the first card is provided with the reset mark 26, with the result that when the second card is thereafter inserted in the card reader, the counter will not be reset but will continue counting through a second set of address locations. If more comparison values are required that can be provided on two cards, additional cards can be marked and decoded to set the counter at specified beginning addresses for such additional cards.

As the counter 50 cycles the RAM energized by the bin identification clock through its address locations, the comparison values on the cards are entered into the RAM representing the selected bin. It is the BCD decoder which is responsive to the marks on the card by extracting the same and entering the information representative thereto into the RAM representing the selected bin. That is, decoder 47 includes a converter for converting the ten-line decimal markings to four-line binary code decimal. It will be appeciated that the converter is an important aspect of the invention in that it provides the memory interface enabling the card to be marked in an easily understandable decimal system while yet providing binary data to the memory.

After card 20 has been passed through the card reader and thereby provided to the memory comparison values representing the bin tolerance limits for the parameters set forth on such card, additional cards are also marked to provide comparison values for the other bins and for other parameters. Such cards are then also fed through the card reader to place in the memory 27 not only comparison values for differing parameters of a device to be tested, but also differing tolerance comparison values for each of such parameters.

After the memory of the tester is filled as described above with comparison values, the apparatus is ready to check devices to distribute the same into a plurality of classification groups represented by the bins. In this connection, when a programming card is not present in the card reader, the switch 34 maintains the memory 27 in an output mode.

The devices to be tested are sequentially connected to the measuring test circuitry 28 by being plugged in turn into the socket 14 therefor provided on the panel of the tester. Parameter checking is then initiated by depressing the test button 16. Such test initiation is represented in FIG. 3 by the test control block 56. While in this preferred embodiment testing is simply initiated by depressing the button 16, it will be appreciated that other means could also be provided for initiating the tester. For example, testing could be automatically initiated by an automatic device handler which would also connect devices to be tested to the measuring circuitry. Moreover, a data logger could be used to initiate the test.

Depression of the button 16 energizes an oscillator 57 which develops and delivers to a counter 58 pulses which cycle the measuring test circuitry through the testing operation. That is, pulses from the counter 58 are delivered through a divider 59 to a test selector in the form of a programmable read-only memory 61 which directs the test circuitry to sequentially test the different parameters to be checked. Pulses from the counter 58 are simultaneously directed to a read-address counter 62. As illustrated, read-address counter 62 is connected through the switch 34 to the memory in order to sequentially direct readout of the address locations to provide comparsion values for comparison with the measured parameter values obtained with the measuring test circuitry. It should be noted that because counter 59 actuates both the memory readout and the measuring of the parameter, one is assured that the proper comparison value will be read out for comparison with any specific measured vaue. The information in the bins is sequentially read-out of such bins for the comparison until such time all measured values of a device fall within the tolerance limits set by the comparison values in a bin to represent a classification group. Such sequential bin operation is controlled, as will be discussed in more detail hereinafter, by a bin read selector in the form of a programmable read-only memory 63.

Means are included for assuring that both the measured value of a parameter and its comparison value delivered from the memory are in comparable forms. That is, the measured value of the parameter obtained from the measuring test circuitry 28 will by an analog value, e.g., a voltage level, whereas the comparison value read from the memory 27 will be in binary code. The apparatus therefore includes a BCD-to-analog converter 64 for converting such binary code to an analog value to be fed to the comparator 31. It should be noted that rather than converting the binary read-out to analog, the analog read-out from the measuring test circuitry could be converted to binary code for the comparison.

In order to enable an operator to visually observe how the measured value compares with the comparison value, both values are fed through a selection switch 66 to the digital display 17 for such visual comparison. Also, any "fail" comparison made by the comparator 31 will be fed to a counter 67 which counts the same. The output of the counter 67 is directed to the bin select PROM 63. Such PROM is connected to the memory RAMs as indicated by flow line 68 and is preprogrammed to direct read-out from RAM 36 (bin 1) at a count of zero. Upon a failure, though, the counter 67 advances by one, and PROM 63 responds thereto by directing read-out from the next succeeding RAM, RAM 37. PROM 63 will also react to such a count by directing the measuring test circuitry to redo the specific test with the new bin comparison value and then continue with the remaining tests from the new bin. This operation is indicated by the flow line 69.

The visual display 31 is also controlled by PROM 63. such display will show which bin is being tested. That is, the display 31 includes the bin lamps 19 on the panel of the tester, and such PROM will react to the failure count not only by advancing the memory from one bin to the next, but also by advancing the energization of one bin lamp to the next. If the counter 67 counts more than five failures, indicating that the device under test does not meet or exceed the tolerance limits of any of the bins, PROM 63 is programmed to react thereto by energizing the "FAIL" lamp on the panel. It should be noted that until such time as the FAIL lamp is energized, the "PASS" lamp will be energized.

From the above, it will be seen that when a device to be tested is plugged into the socket 14 and the test button is depressed, the apparatus will automatically cycle through a comparison of a plurality of different parameters of a device to be tested. The PROM 61 acts as means for performing such function. In addition, the PROM 63 acts as means responsive to a comparison indicating that a measured value falls outside a tolerance limit fed into a bin, by sequentially directing comparison of such measured value with the tolerance limit in the next succeeding bin. In this manner, not only are a plurality of differing parameters of each device checked to ascertain whether or not the device operates properly, but also each parameter is checked, if necessary, against a plurality of different tolerance limits so that those devices which have a minimum operation capability can be categorized by their capability of exceeding a tolerance limit below such capability.

Figure 4:
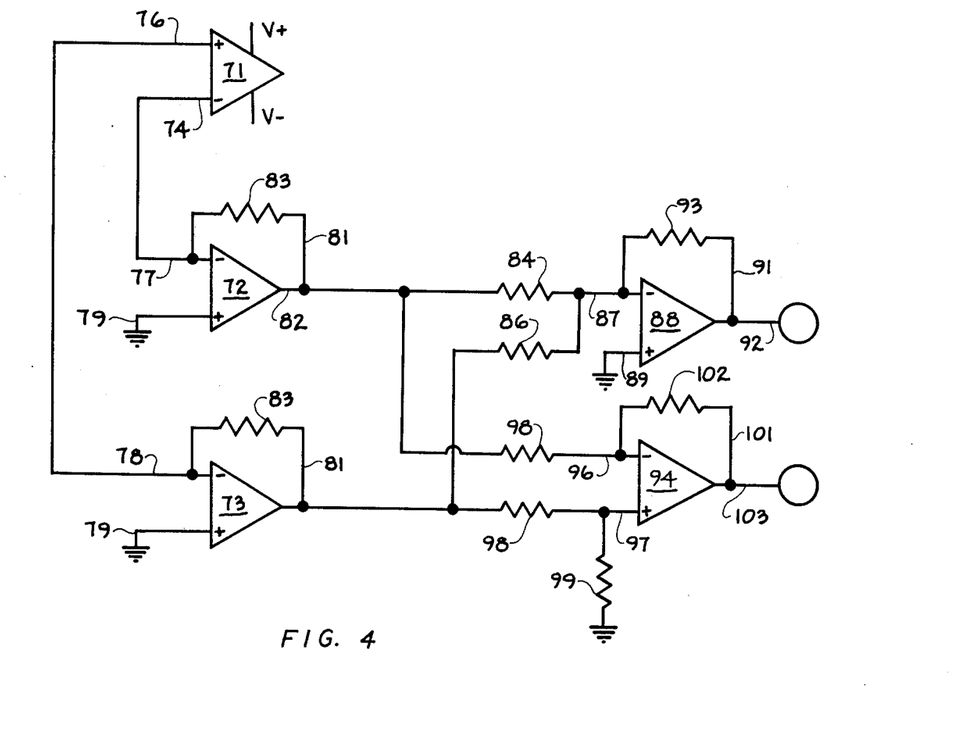
FIG. 4 is a circuit diagram of a test circuit of the invention for measuring the input currents flowing into the inverting and non-inverting input terminals of an operational amplifier.

As mentioned previously, the particular measuring test circuitry included as part of the tester will depend upon the particular devices to be tested. While it is within the skill of the art to provide suitable measuring test circuitry, as another feature of the invention it includes an especially simple and inexpensive test circuitry for measuring the values of the input currents flowing into the inverting and non-inverting input terminals of an operation amplifier. Typically, such values are compared to one another to provide meaningful information. That is, the average of the two input currents, called the input bias current (Ib) is determined, as well as the difference between the two input currents, such difference being called the input offset current (Ios). In the past, this has been accomplished by measuring one of the input currents, storing such first measurement while the input current to the other terminal is measured, and then obtaining the average of, and the difference between, the two measurements. Because of the necessity of storing one of the input current measurements while the other is being determined, the circuitry required for obtaining the input bias and input offset currents has been relatively complicated and expensive. The present invention, though, includes a simplified circuitry for this purpose. In this connection, the circuit of the invention does not require a measurement of one of the input currents be stored while the other is being measured before a comparison of the two can be made. With reference to FIG. 4 which illustrates such circuitry, an operational amplifier 71 to be tested is shown with energization voltages conventionally applied thereto in order to actuate the same. The test circuit includes a pair of second operational amplifiers 72 and 73 connected respectively to the inverting 74 and non-inverting 76 terminals of the amplifier to be tested. More particularly, the inverting and non-inverting input terminals 74 and 76 of the operational amplifier 71 are connected to the inverting input current terminals 77 and 78 respectively, of their associated operational amplifiers. The non-inverting input terminal of each of such operational amplifiers 72 and 73 is connected to a constant reference voltage - in this case represented by ground 79.

A feedback loop 81 is provided for each of the operational amplifiers 72 and 73 extending between its voltage output terminal 82 and its inverting input terminal 77 and 78 respectively, connected to the input terminals of the operational amplifier to be tested. As illustrated, each of the feedback loops passes through a resistance 83. With this connection, the output voltage of each of the second operational amplifiers 72 and 73 will be proportional to the input currents of operational amplifier 71, multiplied by the value of the resistance 83, if the operational amplifiers 73 and 73 are selected to have input currents at their inverting and non-inverting input terminals which are much less than the expected input currents of the operational amplifier to be tested. There are now available operational amplifiers, such as the LH0052 marketed by National Semiconductor Corporation, Santa Clara, California, which have such low input currents, i.e., in the picoamp and feptaoamp range, that it is even impractical to exactly measure the same. Thus, utilization of such operational amplifiers for the amplifiers 72 and 73 will provide the apparatus with the capability of measuring, to a relatively high degree of accuracy, the input currents of a more conventional operational amplifier having input currents within the microamp or nanoamp range. As a practical matter, to achieve reasonable accuracy the operational amplifiers selected for amplifiers 72 and 73 should have input currents at their respective inverting and non-inverting input terminals which are at least an order of magnitude less than the input currents expected at the input terminals of the operational amplifier to be tested. Because operational amplifiers in the pico and feptoamp range have input currents which are at least three to six orders of magnitude less than the input currents expected of more conventional operational amplifiers, a relatively high degree of accuracy can be achieved.

Means are connected to the output terminals of both of the operational amplifiers 72 and 73 to determine the average of the input currents of amplifier 71 as well as to determine the difference between such input currents. That is such means provides both the input bias current (Ib) and the input offset current (Ios) of the operational amplifier under test. The input bias current is obtained by first summing the outputs from the amplifiers 72 and 73. More particularly, such outputs are both connected through resistors 84 and 86 to the inverting input terminal 87 of a third operational amplifier 88. The non-inverting input terminal 89 of the amplifier 88 is connected to a constant reference voltage source, such as ground as shown. A feedback loop 91 extends from the output terminal 92 of the amplifier 88 to the inverting terminal 87. As illustrated, such feedback loop includes a resistance 93. With this arrangement, the output voltage on the terminal 92 of the operational amplifier 88 is proportional to the voltage applied to its inverting terminal 87 and, hence, the sum of the output voltages from the operational amplifiers 72 and 73. The ratio of the value of the resistance 93 to the resistance provided by the resistors 84 and 86 determines the value of the voltage at output 92 relative to the output values on the output terminals 82 of the two operational amplifiers 72 and 73. Most desirably, resistance 93 is selected to be equal to one-half of the resistance provided by the resistors 84 and 86, with the result that the voltage at the output terminal 92 will equal one-half of the voltage applied at any given time to the input terminal 87 of the amplifier 88. As discussed above, it is the sum of the voltages (as reduced by the resistors 84 and 86) which is applied to the input terminal 87. Since such voltages are, though, proportional to the input currents at the inverting and non-inverting terminals 74 and 76 of the operational amplifier under test, the voltage at the output terminal 92 of the operational amplifier 88 will have a value indicative of the average of such input currents. In other words, its value will provide the desired measurement of the bias current of the operational amplifier 71.

The input offset current (Ios) of the oerational amplifier 71, i.e., the difference between the input currents to its primary input terminals is determined with the use of an additional operational amplifier 94. That is, as illustrated, the output terminals 82 of the operational amplifiers 72 and 73 are also respectively connected to the inverting 96 and non-inverting terminals 97 of the amplifier 94 through resistors 98. Non-inverting terminal 97 also has a voltage divider in the form of a resistor 99 connected between it and ground, and a feedback loop 101 extends through another resistor 102 extending between the output terminals 103 of the operational amplifier 94 and its inverting input terminal 96. With this circuitry arrangement, the voltage at the output terminal 103 will be indicative of the difference between the output voltages on the output terminals 82 of the respective operational amplifiers 72 and 73. More particularly, if the vaues of the resistors 98, 99 and 102 are essentially equal to one another, the voltage at 103 will be equal to the value of any one of such resistors, multiplied by the difference between the input currents on the operational amplifier 71. In this connection, it must be remembered that the voltages on output terminals 82 are each equal to the resistance 83 in the feedback loop of their operational amplifier, multiplied by the input currents to be measured.

From the above, it will be seen that both the input offset current (Ios) and the input bias current (Ib) of the operational amplifier 71 under test is obtained with its input currents to its primary input terminals being measured simultaneously and then compared to one another. As can be seen, the circuitry provided as part of the invention for measuring such parameters of the operational amplifier is relatively inexpensive and uncomplicated.

While the invention has been described in connection with preferred embodiments thereof, it will be appreciated by those skilled in the art that various changes can be made without departing from its spirit. It is therefore intended that the coverage afforded Applicant be limited only by the terms of the claims and their equivalent language.

I claim:

1. Apparatus for checking one or more electrical parameters of a plurality of similar electronic circuit devices to be tested comprising: means for extracting from programming means information providing a plurality of differing tolerance comparison values for a parameter of such devices to be checked, said values represent differing classfication groups into which said plurality of similar electronic circuit devices are to be distributed; means for measuring the value of the parameter of one of said electronic circuit devices to be checked; means for comparing the measured value of the parameter with said plurality of differing tolerance comparison values to identify a classification group corresponding to said measured value; and means for displaying the results of said comparison.

2. The apparatus of claim 1 further including memory means for receiving information representatives of said plurality of differing comparison values for a parameter to be checked and storing the same for later recall when the parameter of interest is to be checked.

3. The apparatus of claim 2 wherein said memory means includes address locations for comparison values for differing parameters of an electronic circuit device to be tested.

4. The apparatus of claim 2 wherein said programming means is a plurality of programming cards, each having a first response area for indicia indicative of a comparison value for a parameter to be checked of an electronic circuit device and a second response area for indicia indicative of a selected classification group represented by said comparison value; and wherein said means for extracting said information from said programming means is a card reader which includes decoding means responsive to indicia in said response areas of said cards by entering information representative of the same into said memory means.

5. The apparatus of claim 4 wherein said first response area on said card includes applied thereto for each of a plurality of parameters of an electronic circuit device to be checked, a Hollerith code providing an array of potential comparison values in a decimal numercial system, and said decoding means includes a converter for converting a comparison value selected in decimal form from said Hollerith code to a binary digital code for entry into an address location therefor in said memory means.

6. The apparatus of claim 5 further including means for converting one of said measured value and said comparison value from said memory means to the same form as the other for said comparison.

7. The apparatus of claim 6 further including means responsive to a comparison by said comparison means indicating that the measured value of a parameter to be checked falls outside the tolerance limit against which it is checked by sequentially directing comparison of said measured value with the next succeeding tolerance comparison value for said measured value to identify a classification group into which the device having said measured parameter value is to be distributed.

8. Apparatus for checking the values of the input current flowing into the inverting and non-inverting input terminals of an operational amplifier to be tested comprising: a card reader for extracting from a programming card information providing comparison values for the input currents to be checked; means for measuring the values of said input currents of said operational amplifier to be checked including a pair of second operational amplifiers selected to have input currents at their respective inverting and non-inverting input terminals at least an order of magnitude less than the input currents expected of the operational amplifier to be tested, one of the inverting and non-inverting input terminals of both of said second operational amplifiers being connected to a reference voltage source and the other of said input terminals of each of said second operational amplifiers being connected respectively to an associated one of the inverting and non-inverting terminals of the operational amplifier to be tested; a feedback loop on each of said second operational amplifiers extending through a resistance between the output terminal thereof and the one of said inverting and non-inverting terminals thereof connected to said input terminal of said operational amplifier to be tested, whereby the voltage at the output terminal of each second operational amplifier is proportional to the input current to be measured thereby; means for comparing the voltage at the output terminal of each of said second operational amplifiers with the comparison values provided by said programming card; and means for displaying the results of said comparison.

9. A test circuit for measuring the input currents flowing into the inverting and non-inverting input terminals of an operational amplifier to be tested comprising: a pair of second operational amplifiers selected to have input currents at their respective inverting and non-inverting input terminals at least an order of magnitude less than the input currents expected of the operational amplifier to be tested, one of the inverting and non-inverting input terminals of both of said second operational amplifiers being connected to a reference voltage source and the other of said input terminals of each of said second operational amplifiers being connected respectively to an associated one of the inverting and non-inverting terminals of the operational amplifier to be tested; and a feedback loop on each of said second operational amplifiers extending through a resistance between the output terminal thereof and the one of said inverting and non-inverting input terminals thereof connected to said input terminal of said operational amplifier to be tested, whereby the voltage at the output terminal of each of said second operational amplifiers is proportional to the input current to be measured thereby.

10. The test circuit of claim 9 further including means connected to the output terminals of both of said second operational amplifiers for determining the average of the input currents flowing into the inverting and non-inverting input terminals of said operational amplifier to be tested.

11. The test circuit of claim 10 wherein said means for determining the average of said input currents flowing into said inverting and non-inverting input terminals includes a third operational amplifier having one of its inverting and non-inverting input terminals connected to a reference voltage source and the other one connected through a second resistance to the outputs of both of said second operational amplifiers; and a feedback loop on said third operational amplifier extending through a third resistance between the output terminal thereof and the one of said inverting and non-inverting input terminals connected to both of said output terminals of said second operational amplifiers, the ratio of said third resistance to said second resistance being selected to change by a predetermined proportionate amount the output voltage of said third operational amplifier relative to the combined output voltages of said second operational amplifiers connected to said one of said inverting and non-inverting terminals of said third operational amplifier.

12. The test circuit of claim 9 further including means connected to the output terminals of said second operational amplifiers for determining the difference between the input currents flowing into the inverting and non-inverting input terminals of said operational amplifier to be tested.

13. The test circuit of claim 12 wherein said means for determining the difference between the input currents flowing into said inverting and non-inverting input terminals of said operational amplifier to be tested includes a third operational amplifier having its inverting and non-inverting input terminals respectively connected to the output terminals of said second operational amplifiers; and a feedback loop extending through a resistance between the output terminal of said third operational amplifier and one of said inverting and non-inverting input terminals of said third operational amplifier whereby the voltage on said output terminal is indicative of the difference between the voltages applied by said second operational amplifiers to said input terminals of said third operational amplifier.

14. The operational amplifier of claim 12 further including means connected to the output terminals of both of said second operational amplifiers for determining the average of the input currents flowing into the inverting and non-inverting input terminals of said operational amplifier to be tested.

15. The operational amplifier of claim 14 wherein said means for determining the average of said input currents flowing into said inverting and non-inverting input terminals of said operational amplifier to be tested includes a third operational amplifier having one of its inverting and non-inverting input terminals connected to a reference voltage source and the other one of said input terminals connected through a second resistance to the outputs of both of said second operational amplifiers, and a feedback loop on said third operational amplifier extending through a third resistance between the output terminal thereof and the one of said inverting and non-inverting input terminals connected to both of said output terminals of said second operational amplifiers, the ratio of said third resistance to said second resistance being selected to change by a predetermined proportionate amount the output voltage of said third operational amplifier relative to the combined output voltages of said second operational amplifiers connected to said one of said inverting and non-inverting terminals of said third operational amplifier; and wherein said means for determining the difference between the input currents flowing into said inverting and non-inverting terminals includes an additional third operational amplifier having its inverting and non-inverting input terminals respectively connected to the output terminals of said second operational amplifiers, and a feedback loop extending through a resistance between the output terminal of said additional third operational amplifier and one of said inverting and non-inverting input terminals of said additional third operational amplifier whereby the voltage on said output terminal is indicative of the difference between the voltages applied by said second operational amplifiers to said input terminals of said additional third operational amplifier.

16. A method for checking one or more electrical parameters of an electronic circuit device comprising the steps of: providing a programming card having first and second response areas thereon, said first response area being adapted for receipt of indicia indicative of a tolerance comparison value for a parameter of an electronic circuit device to be checked and said second response area being adapted for receipt of indicia indicative of a select classification group represented by any comparison value entered in said first response area; marking said first response area with indicia indicative of a selected tolerance comparison value for a parameter to be checked; marking said second response area with indicia indicative of a selected classification group represented by the selected tolerance comparison value; feeding the marked programming card into a card reader adapted to extract therefrom the information providing said tolerance comparison value and said selected classification group; measuring the actual value of the parameter to be checked of the electronic circuit device; comparing the measured value of the parameter with said comparison value therefor; and displaying the results of said comparison.

17. The method of claim 16 further including the step of storing the information extracted from said card providing said comparison value for later recall for said step of comparing the same with the measured value of said parameter of an electronic circuit device to be tested.

18. The method of claim 17 wherein said first response area is adapted to receive indicia indicative of pluralities of differing tolerance comparison values for a plurality of different parameters of an electronic circuit device to be tested, and said step of marking said first response area includes marking the same with indicia indicative of a selected comparison value for each of said plurality of parameters; said step of storing said information provided on said first response area for all of said parameters to be checked; said step of measuring the actual value of the parameter to be checked includes sequentially measuring the values of all of the parameters to be checked; and said step of comparing the measured value of the parameter with said comparison value includes sequentially recalling said tolerance comparison values from said memory for comparing each with the associated measured value of the parameter to be checked.

19. The method of claim 18 wherein said first response area on said programming card includes for each of said parameters a Hollerith code providing an array of potential comparison values in a decimal numerical system; and said step of extracting the information from said Hollerith code providing said comparison value on said first response area includes converting the information selected in decimal form from said Hollerith code to a binary digital code for said storing; and said step of sequentially comparising said comparison values for said parameters with said actual measured values, includes the step of converting said comparison values extracted from said memory to the same form as said measured values for said comparison.

20. The method of claim 19 wherein said steps of marking said card includes marking for each of said parameters a plurality of their respective cards on said first response areas with respective different tolerance comparison values representative of differing selected classification groups and marking the second response area on each of said cards to indicate the selected classification group represented by the indicia marked on said first response area; said step of feeding includes feeding said plurality of cards into said card reader for extraction therefrom of information providing said plurality of comparison values and said classification groups; and said step of comparing the measured values of said parameters with said comparison values includes the step of sequentially comparing each of said measured values with said plurality of differing tolerance comparison values to identify a classification group into which the device having said measured parameter value is to be distributed.

* * * * *